United States Patent Office 3,536,541
Patented Oct. 27, 1970

3,536,541
METHOD OF MANUFACTURING DIFFUSED JUNCTIONS IN SEMI-CONDUCTORS

Daniel Le Coq, Rueil-Malmaison, France, assignor, by mesne assignments, to U.S. Philips Corporation, New York, N.Y., a corporation of Delaware No Drawing. Filed June 22, 1967, Ser. No. 647,958
Int. Cl. H01l 5/02
U.S. Cl. 148—33 3 Claims

ABSTRACT OF THE DISCLOSURE

A photo-sensitive target for a camera tube comprising a slice of semiconductor material having adjacent one face a shallow junction at most 150 A. deep produced by diffusion of impurities into the crystal lattice.

The present invention relates to a method of manufacturing mosaics of diffused junctions in semi-conductor bodies and to semi-conductor bodies made by this method.

The term "mosaic" as used herein is to be understood to mean a system of junctions which are situated substantially in one plane in a semi-conductor body which may serve as a radiation sensitive target in a camera tube. On irradiation of such a target the junctions, which operate as photo-diodes, build up a charge pattern on a surface of the body which extends parallel to the said plane.

As is known such targets have to satisfy the following requirements: the junctions must have minimum surface areas, for the said junctions the space factor of the substrate must be a maximum, and the charges stored in a junction which contain the partial information must not flow off to an adjacent junction. Finally the definition and the slowness of the image depend upon the depth of the junctions, that is to say on the time which the electrons require to reach the pn-junctions. Hence it is necessary for the junctions to be situated close to the irradiated surface of the semi-conductor body.

The present invention satisfies these requirements.

According to the invention a method of manufacturing a mosaic of diffused junctions in a semi-conductor body, in which a diffusion of a doping element which gives rise to a determined conductivity type is carried out in a single-crystal semi-conductor body of the opposite conductivity type, is characterized in that a diffused surface zone is formed the thickness of which is limited to at most 150 A. and by which diffused junctions are produced which laterally merge into one another.

Preferably the thickness of the surface zone is limited to about 100 A. Very good results are obtained with a thickness of at most ten times the lattice constant of the crystal lattice of the semi-conductor body.

The formation of diffused junctions in a semi-conductor body depends upon a number of parameters such as the diffusion constant and the surface concentration of the doping element, the impurity concentration in the substrate, the diffusion time and the temperature.

The method according to the invention is carried out by a known process for diffusing a doping element from the vapour state, in which a flow of gas entrains the vapour containing the doping element over the semiconductor substrate to be doped. The diffusion source of the doping element and the substrate are disposed so as to be spaced from one another by a certain distance in the reaction space of a furnace in the form of a long tube, the diffusion source being heated to a temperature at which the doping element vaporises and the substrate being heated to a temperature which is suitable for diffusion; any cold point between the diffusion source and the substrate is avoided in order to prevent condensation of the doping element. The substrate may, for example, be a single-crystal slice of n-type silicon having a resistivity of 2 to 3 ohm cm. Its thickness is 2 mm. It is placed in the furnace and heated at a temperature of about 400° C. The diffusion source containing boron oxide, which is also placed in the furnace, is heated at a temperature from 600° C. to 900° C. The furnace comprises a quartz tube. A flow of gas, for example hydrogen or nitrogen, flows through the tube at a rate of 1½ litre/minute. Viewed in the direction of the gas flow the substrate is arranged behind the diffusion source. Diffusion is performed for two to five minutes, giving a diffused layer of limited depth. A layer of 100 A. thickness provides good results. If necessary, the thickness of the diffused layer may be reduced by etching.

The resistance of the resulting layer in the transverse direction is such that it is not necessary to separate the junctions by the provision of grooves.

What is claimed is:

1. A photosensitive device comprising a radiation-responsive semiconductor wafer-shaped body adapted on irradiation to build up a charge pattern for use in a camera tube, said body comprising a single crystal of semiconductive material of one type conductivity having adjacent one face a surface diffused zone of the opposite conductivity type whose thickness is at most 150 A. forming a shallow p-n junction adjacent said one face, said surface diffused zone having a high sheet resistance in the transverse direction such that said junction behaves as a mosaic of semiconductor junctions.

2. A device as set forth in claim 1 wherein the body is a slice of n-type single crystal silicon, the surface zone contains boron as impurity making it p-type, and the thickness of the surface zone is at most 100 A.

3. A device as set forth in claim 1 wherein the body is a target electrode in a camera tube, and the thickness of the surface zone is at most ten times the lattice constant of the semiconductor crystal.

References Cited

UNITED STATES PATENTS

| | | | |
|---|---|---|---|
| 3,011,089 | 11/1961 | Reynolds | 315—10 |
| 3,415,992 | 12/1968 | Webb | 317—235 |

L. DEWAYNE RUTLEDGE, Primary Examiner
R. A. LESTER, Assistant Examiner

U.S. Cl. X.R.

136—89; 148—186; 315—10; 317—234